(12) United States Patent
Kim

(10) Patent No.: US 7,068,265 B2
(45) Date of Patent: Jun. 27, 2006

(54) SCAN STRUCTURE IN DISPLAY DEVICE, METHOD FOR DRIVING THE DISPLAY DEVICE, AND METHOD FOR MANUFACTURING THE SAME

(75) Inventor: Hak Su Kim, Seoul (KR)

(73) Assignee: LG Electronics Inc., Seoul (KR)

( * ) Notice: Subject to any disclaimer, the term of this patent is extended or adjusted under 35 U.S.C. 154(b) by 169 days.

(21) Appl. No.: 10/136,277

(22) Filed: May 2, 2002

(65) Prior Publication Data

US 2002/0180670 A1    Dec. 5, 2002

(30) Foreign Application Priority Data

May 4, 2001    (KR) .............................. P2001-24360

(51) Int. Cl.
*G09G 5/00*    (2006.01)

(52) U.S. Cl. ......................... 345/213; 345/208; 345/79

(58) Field of Classification Search ................ 345/103, 345/76, 79, 208, 209, 211, 212, 213; 315/169.3
See application file for complete search history.

(56) References Cited

U.S. PATENT DOCUMENTS

| | | | | |
|---|---|---|---|---|
| 4,797,667 A | * | 1/1989 | Dolinar et al. ................. | 345/76 |
| 5,457,565 A | | 10/1995 | Namiki et al. ............... | 359/273 |
| 5,677,546 A | | 10/1997 | Yu .............................. | 257/40 |
| 5,834,893 A | | 11/1998 | Bulovic et al. ............. | 313/506 |
| 5,963,190 A | * | 10/1999 | Tsuboyama et al. ........ | 345/103 |
| 6,366,026 B1 | | 4/2002 | Saito et al. ............... | 315/169.3 |
| 6,373,187 B1 | | 4/2002 | Nagayama et al. ......... | 313/506 |
| 2001/0024187 A1 | * | 9/2001 | Sato et al. ..................... | 345/98 |

FOREIGN PATENT DOCUMENTS

| | | |
|---|---|---|
| CN | 1115535 A | 1/1996 |
| EP | 0837445 A1 | 4/1998 |
| EP | 0949603 A1 | 10/1999 |
| JP | 57-114189 | 7/1982 |
| JP | 10-321372 | 12/1998 |
| JP | 11-111455 | 4/1999 |
| JP | 2000-29432 | 1/2000 |
| JP | 2000-259124 | 9/2000 |
| JP | 2001-6881 | 1/2001 |
| JP | 2001-085167 | 3/2001 |
| JP | 2001-85167 | 3/2001 |

OTHER PUBLICATIONS

English Translation of Office Action issued by Chinese Patent Office on Dec. 17, 2004.

* cited by examiner

*Primary Examiner*—Kent Chang
(74) *Attorney, Agent, or Firm*—Fleshner & Kim, LLP (57) ABSTRACT

A scan structure of a display device, a method for driving the display device, and a method for manufacturing the same is disclosed, which is for physically decreasing a duty in half, maintaining uniform picture quality. In the display device having a plurality of data lines formed in one direction, a plurality of scan lines formed in perpendicular to the plurality of data lines, a plurality of pixels are formed, which are connected to the plurality of data lines in each scan line, so that the total scan time is increased in proportion to the number of the pixels in each scan line.

17 Claims, 11 Drawing Sheets glass substrate

SCAN STRUCTURE IN DISPLAY DEVICE, METHOD FOR DRIVING THE DISPLAY DEVICE, AND METHOD FOR MANUFACTURING THE SAME

This application claims the benefit of the Korean Application No. P2001-24360 filed on May 4, 2001, which is hereby incorporated by reference.

BACKGROUND OF THE INVENTION

1. Field of the Invention

The present invention is related to a display device, and more particularly, to a scan structure in a display device for decreasing a duty at a passive panel, a method for driving the display device, and a method for manufacturing the same.

2. Discussion of the Related Art

Recently, flat panel displays have been rapidly developed. In especial, the flat panel display such as a liquid crystal display (LCD) device substitutes for a cathode ray tube (CRT). Also, the flat panel displays such as a plasma display panel (PDP), a vacuum fluorescent display (VFD), a field emission display (FED), a light emitting diode (LED) and an electroluminescence (EL) are being actively researched.

The flat panel displays can be used in various fields in that the flat panel displays have an excellent visual perception, a high resolution and simplified process steps.

With a trend of large sized and high resolution flat panel displays, more current is used in a driving circuit for driving the displays, and for obtaining desired luminance in the displays.

In this respect, the LCD devices are generally used in monitors for portable information terminals due to less power consumption even though the LCD devices have disadvantages in a response time, a viewing angle and a color depth, as compared to other flat panel displays. However, considering a backlight of the LCD device, the LCD does not consume less power. Accordingly, a transflective or reflective type LCD device having no backlight is generally used.

Recently, with a tendency of the large sized flat panel displays, the organic EL display panel has attracted considerable attentions in that the organic EL display panel occupies small space.

The EL display panel obtaining thinness is addressed in a matrix type, and is driven at a voltage of 15 or less.

Figure 1:
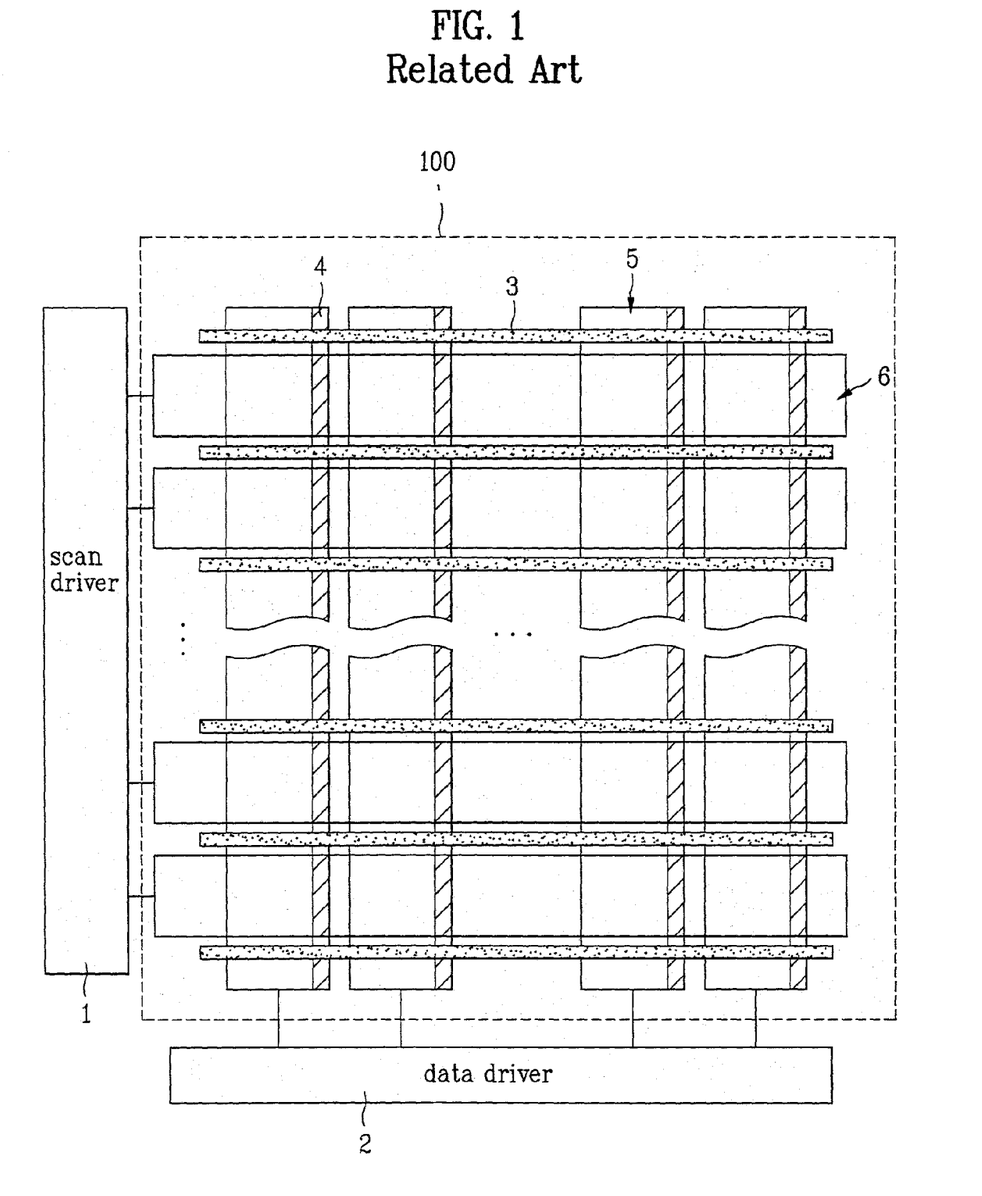
FIG. 1 is a view showing a structure of a related art passive driving type organic EL device.

FIG. 1 is a view showing a structure of a related art passive driving type organic EL device.

As shown in FIG. 1, the device includes an organic EL panel 100, a data driver 2 and a scan driver 3. At this time, a data line 5 and a scan line 6 are formed in a matrix type on the organic EL panel 100 for emitting lights. Then, the data and scan drivers 2 and 3 apply currents to the data and scan lines 5 and 6, so that light is selectively emitted from the organic EL panel 100.

Process steps for manufacturing the organic EL panel 100 will be explained.

First, a transparent electrode is formed on a glass substrate. At this time, the transparent electrode is generally formed of indium tin oxide (ITO). However, the ITO has a high one resistance value, so that a supplemental metal electrode 4 is formed on the glass substrate before forming the transparent electrode or is formed on the transparent electrode.

Subsequently, a barrier 3 is formed for forming the scan line, and an organic material is deposited on entire surfaces of the organic EL panel 100. Then, the scan line is formed of metal, thereby completing the organic EL panel 100.

If a resolution of the organic EL panel 100 having the above structure is 128×128, a total duty is $$\frac{1}{128},$$

which is in inverse proportion to the number of the scan lines.

If a frame frequency is 60 Hz, a scan time Ts assigned to each scan line is calculated as the following equation 1.

$$Ts = \frac{1}{128} \times \frac{1}{60} = 130 \ \mu s \qquad \text{equation 1}$$

If the scan time Ts assigned to each scan line is increased, the power consumption is decreased, and it is possible to easily control luminance of each electrode.

Figure 2:
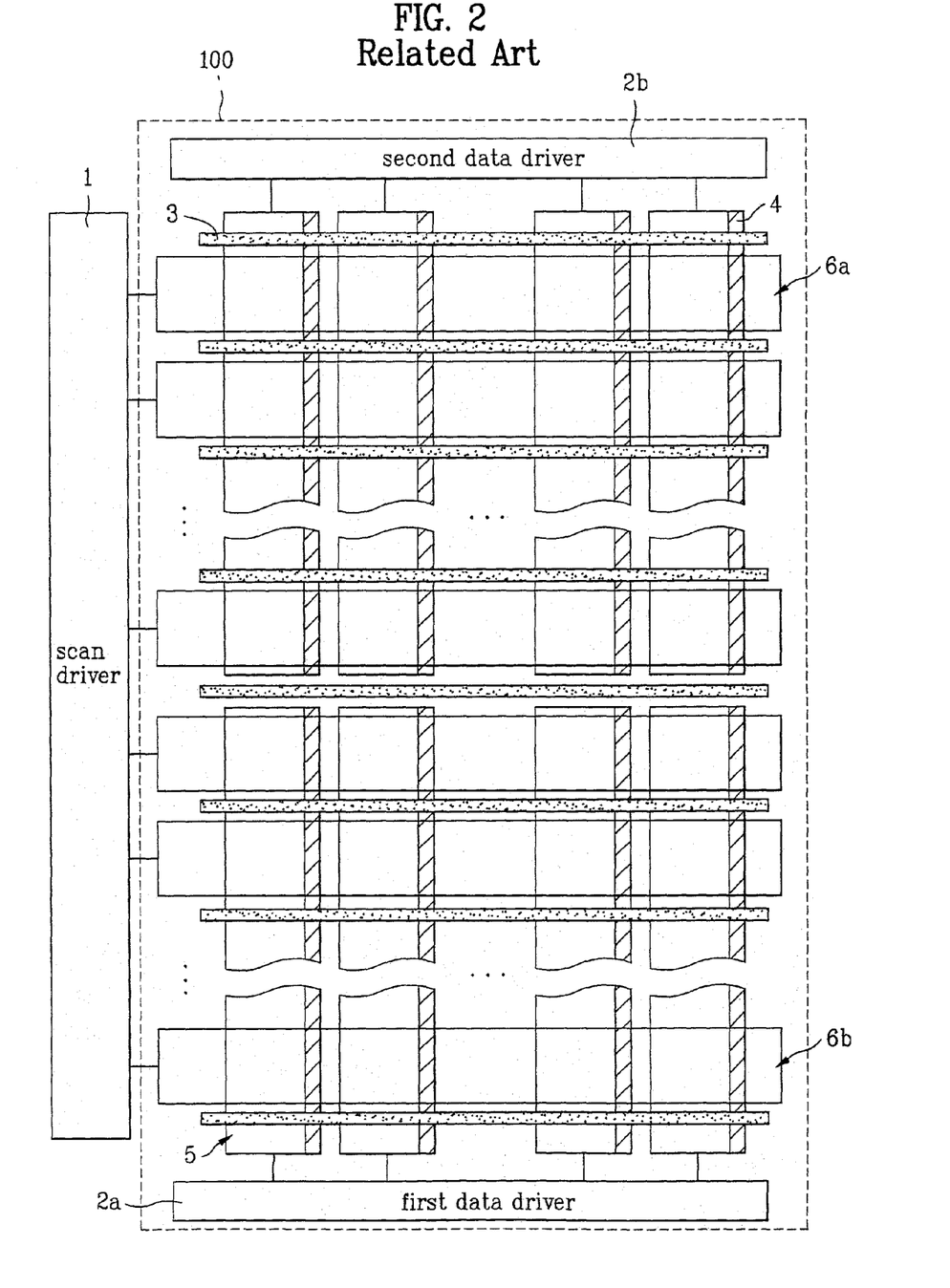
FIG. 2 is a view showing a structure of an improved passive driving type organic EL device according to a related art.

As shown in FIG. 2, a method for physically decreasing a duty in half is used for increasing the scan time Ts.

FIG. 2 is a view showing an improved passive driving type organic EL according to the related art.

As shown in FIG. 2, the display panel (or EL panel 100) is divided into two parts, lower and upper parts, according to a direction of the scan line. That is, the display device is driven in a dual scan method.

The display panel, driven in the dual scan method and having the resolution of 128×128, includes first and second data drivers 2a and 2b for applying signals to 128 data lines 5, and a scan driver 1 for applying signals to 128 scan lines 6a and 6b divided into two parts, each part having 64 scan lines.

In the display panel 100 having the above structure, one scan signal is simultaneously applied to the scan line 6a of one part, and to the scan line 6b of the other part.

The scan signal applied to the signal line 6a of one part (upper part) is connected to the second data driver 2b, so that light is emitted from corresponding electrode. Also, the scan signal applied to the signal Line 6b of the other part (lower part) is connected to the first data driver 2a, so that light is emitted from corresponding electrode.

If the frame frequency is 60 Hz, the scan time assigned to each scan line is calculated as the following equation 2.

$$Ts = \frac{1}{64} \times \frac{1}{60} = 260 \ \mu s \qquad \text{equation 2}$$

As explained above, the scan time assigned to each scan line is doubled, so that the duty is physically decreased in half, thereby decreasing power consumption.

However, the related art dual-scan structure of the display device and method for manufacturing the same has the following problems.

First, a plurality of data drivers is formed in the display device, so that a size of the device is increased, and the system is complicate.

Also, the display panel is divided into two parts, each part having the data driver for applying signals. Accordingly, a current difference may be generated between two parts, thereby deteriorating uniformity of image.

SUMMARY OF THE INVENTION

Accordingly, the present invention is directed to a scan structure in a display device that substantially obviates one or more problems due to limitations and disadvantages of the related art.

An object of the present invention is to provide a scan structure in a display device for physically decreasing a duty in half, maintaining uniform picture quality, and easy driving; a method for driving the display device; and a method for manufacturing the same.

Another object of the present invention is to provide a scan structure in a display device for physically decreasing a duty in half without increasing a size of a driver IC compared with dual-scan structure and dividing a panel; a method for driving the display device; and a method for manufacturing the same.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, in a display device having a plurality of data lines formed in one direction, a plurality of scan lines formed in perpendicular to the plurality of data lines, and a plurality of pixels formed at crossing points of the data and scan lines, a method for driving the display device includes forming pixels by forming at least two scan lines and at least two data lines in a matrix type, and connecting odd numbered or even numbered pixels to a certain data line, for independently operating the pixels.

Preferably, one scan signal is simultaneously applied to at least two scan lines, and the scan lines are divided by barrier.

Preferably, odd numbered pixels are connected to one data line, and even numbered pixels are connected to the other data line.

In another aspect of the present invention, a scan structure of a display device includes a plurality of pixels formed by crossing at least two scan lines and two data lines to one another, the pixels divided into odd numbered pixels and even numbered pixels for being connected to a certain data line, a data driver for applying a data signal to the odd or even numbered pixels according to a direction of the data line, and a scan driver for applying a scan signal to at least two scan lines.

In another aspect of the present invention, a scan structure in a display device includes a plurality of scan lines formed in one direction, for electrically connecting lines of at least two pixels adjacent to each other in parallel, a plurality of data lines formed in perpendicular to the scan lines, for alternately connecting the lines of two pixel, and data and scan drivers selectively applying signals to the data and scan lines, so that light is selectively emitted from corresponding pixels.

In another aspect of the present invention, a method manufacturing a display device includes (a) forming transparent electrodes horizontally and vertically on a substrate, (b) forming a plurality of data lines by electrically connecting odd numbered data lines to one another, or even numbered data lines, to one another, and (c) forming a barrier having at least one electrode in perpendicular to the data line, and forming a plurality of scan lines by depositing an organic material.

Preferably, the transparent electrode is formed of indium tin oxide (ITO).

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, the same reference numbers will be used throughout the drawings to refer to the same or like parts.

A scan structure and a method for manufacturing the same according to the present invention will be explained with reference to the accompanying drawings.

Figure 3:
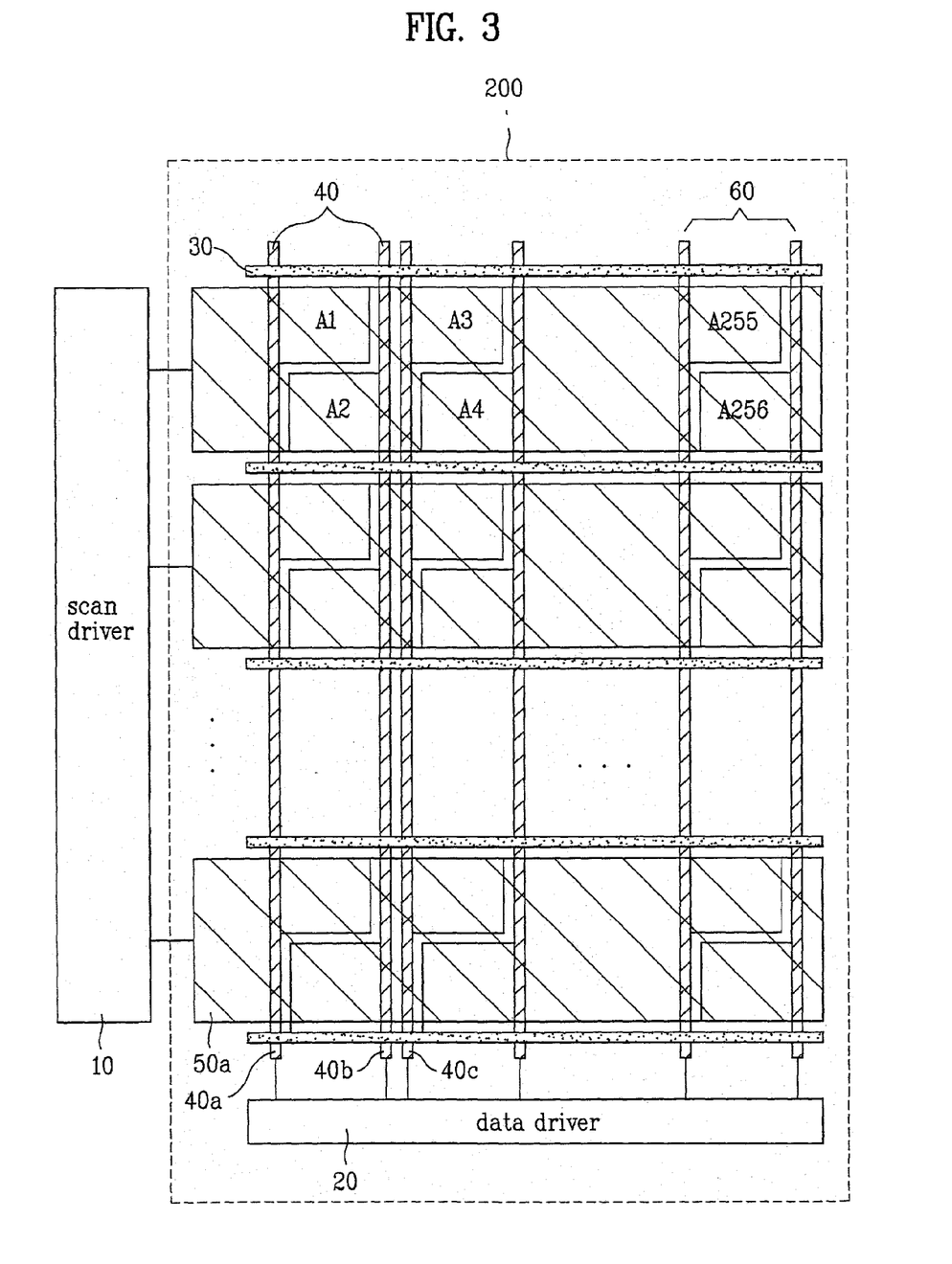
FIG. 3 is a view showing a scan structure of a display device according to the first embodiment of the present invention.

FIG. 3 is a view showing a scan structure of a display device according to the first embodiment of the present invention.

As shown in FIG. 3, the display device according to the present invention includes an organic EL panel 200, a data driver 20 and a scan driver 10.

At this time, a plurality of data lines 60 and scan lines 50a are formed in a matrix type on the organic EL panel 200. That is, the plurality of data lines 60 cross the plurality of scan lines 50a, thereby forming a plurality of pixels (units for emitting lights) of the organic EL panel 200. Then, the data driver 20 and the scan driver 10 selectively apply currents to the data and scan lines 60 and 50a, so that light is selectively emitted from the pixels of the organic EL panel 20.

In the organic EL panel 200, a unit scan line 50a is formed of two scan lines. In this respect, a width of the unit scan line 50a is increased, so that a resistance of the unit scan line 50a is decreased.

In the above organic EL panel 200, one data line serves to connect supplemental metal electrodes 40 corresponding to even numbered scan lines with one another, and the other data line serves to connect supplemental metal electrodes 40 corresponding to odd numbered scan lines with one another.

For example, if one data line 60 is connected to the supplemental metal electrode 40a corresponding to the even numbered scan line, another data line 60 is connected to the supplemental metal electrode 40b corresponding to the odd numbered scan line. Then, another data line 60 is connected to the supplemental metal electrode 40c corresponding to the even numbered scan line. At this time, the supplemental metal electrode 40c is spaced from the supplemental metal electrode 40a, and is adjacent to the supplemental metal electrode 40b.

In the scan structure according to the present invention, the supplemental metal electrode 40a is formed in the same scan line with the supplemental metal electrode 40c.

Accordingly, the number of the scan lines 50a connected to one data line 60 is decreased in half. Meanwhile, each scan line requires two data lines in that two supplemental metal electrodes 40 are controlled by one scan signal.

That is, in the display panel 200 having a resolution of 128×128, the number of the desired data lines 40 is increased as 256, and the number of the desired scan lines 30 is decreased as 64.

A scan time Ts assigned to each scan line is calculated as the following equation 3. At this time, a frame frequency is 60 Hz.

$$Ts = \frac{1}{64} \times \frac{1}{60} = 260 \ \mu s \qquad \text{equation 3}$$

In the above structure, even though the panel according to the present invention is not divided, the scan time assigned to each scan line is doubled as compared with the related art panel. With increase of the scan time Ts, luminance of the display panel according to the present invention is improved.

Also, it is possible to form only one data driver 20 in the display device according to the present invention, thereby decreasing a size of the display device in the present invention.

Figure 4:
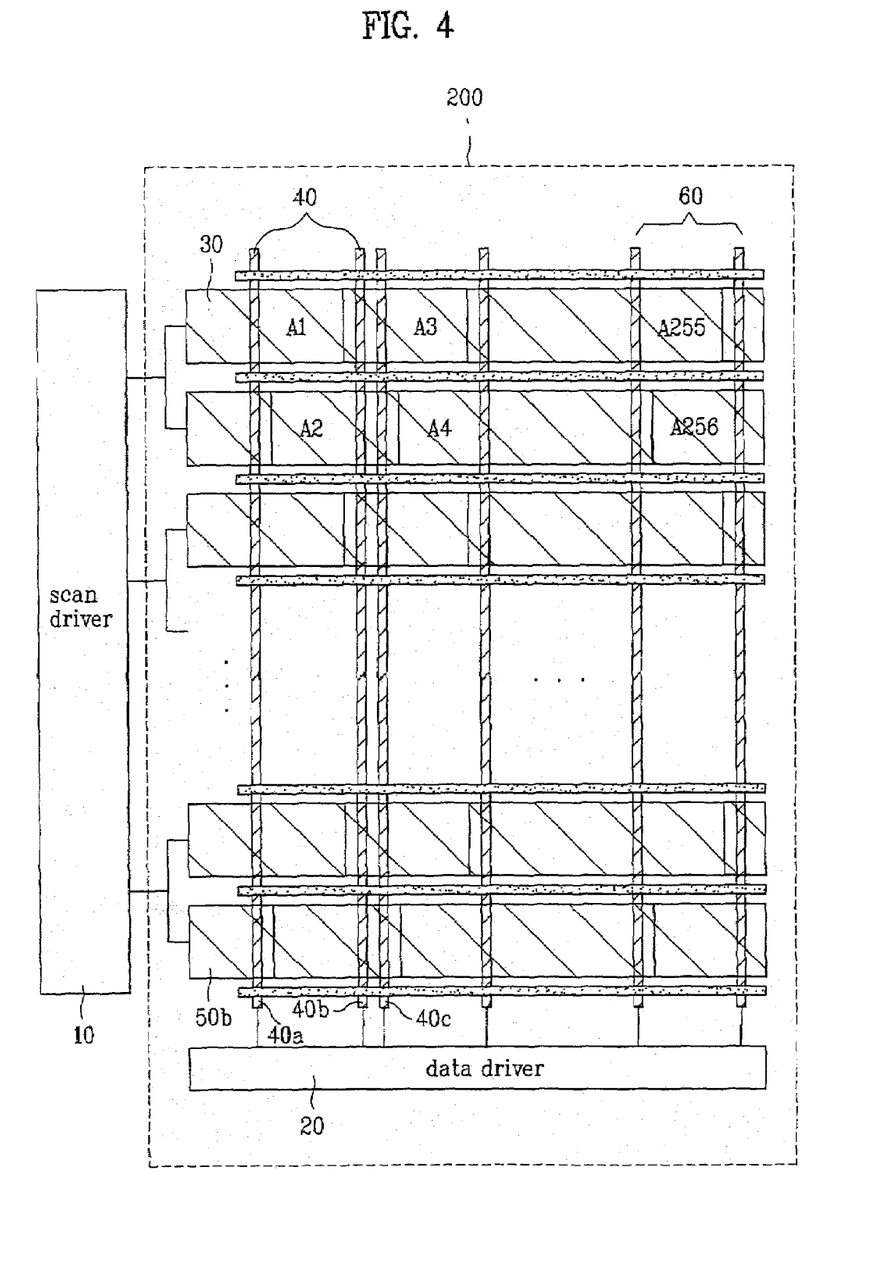
FIG. 4 is a view showing a scan structure of a display device according to the second embodiment of the present invention.

FIG. 4 is a view showing a scan structure of a display device according to the second embodiment of the present invention.

As shown in FIG. 4, the display device includes an organic EL panel 200, a data driver 20 and a scan driver 10.

At this time, a plurality of data lines 60 and scan lines 50b are formed in a matrix type on the organic EL panel 200. Then, the data driver 20 and the scan driver 10 apply signals to the data and scan lines 60 and 50b, so that light is selectively emitted from the organic EL panel 20.

In the organic EL panel 200, two scan signals are simultaneously applied from the scan driver 10 to the scan lines 50b. That is, the first scan signal is simultaneously applied to the first and second scan lines, and then the second scan signal is simultaneously applied to the third and fourth scan lines.

Like FIG. 3, one data line serves to connect supplemental metal electrodes corresponding to even numbered scan lines with one another, and the other data line serves to connect supplemental metal electrodes corresponding to odd numbered scan lines with one another.

In the display panel having a resolution of 128×128, the number of desired data lines is increased as 256, and the number of desired scan lines is 128. At this time, two scan lines are controlled by one scan signal, so that the 64 scan lines are actually used.

In the above structure, a scan time Ts assigned to each scan line is calculated as the following equation 4. At this time, a frame frequency is 60 Hz.

$$Ts = \frac{1}{64} \times \frac{1}{60} = 260 \ \mu s \qquad \text{equation 4}$$

In the above structure, even though the panel according to the present invention is not divided, the scan time assigned to each scan line is doubled as compared with the related art panel.

Also, it is possible to form only one data driver 20 in the display device according to the present invention, thereby decreasing a size of the display device in the present invention.

A method for manufacturing the display device according to the present invention will be explained with reference to the accompanying drawings.

FIG. 5 to FIG. 10 are views showing the manufacturing process steps of the display device according to the present invention.

Figure 5:
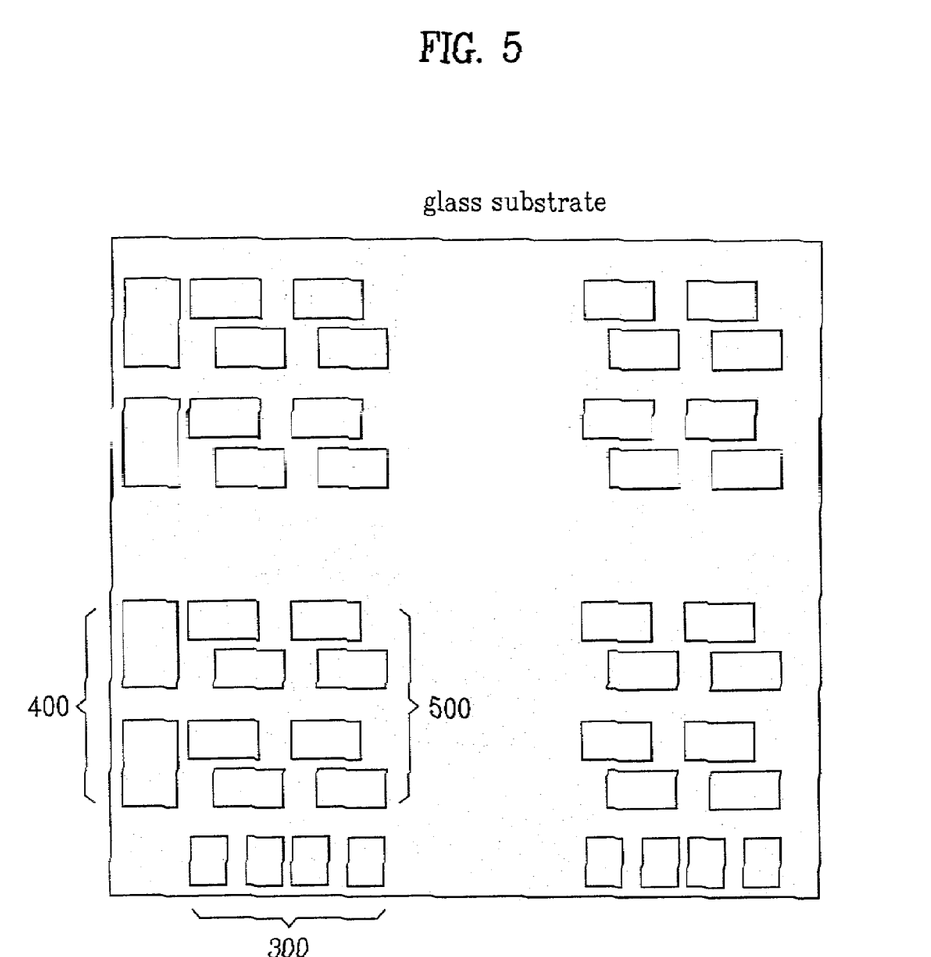
FIG. 5 to FIG. 10 are views showing manufacturing process steps of a display panel according to the present invention.
Figure 6:
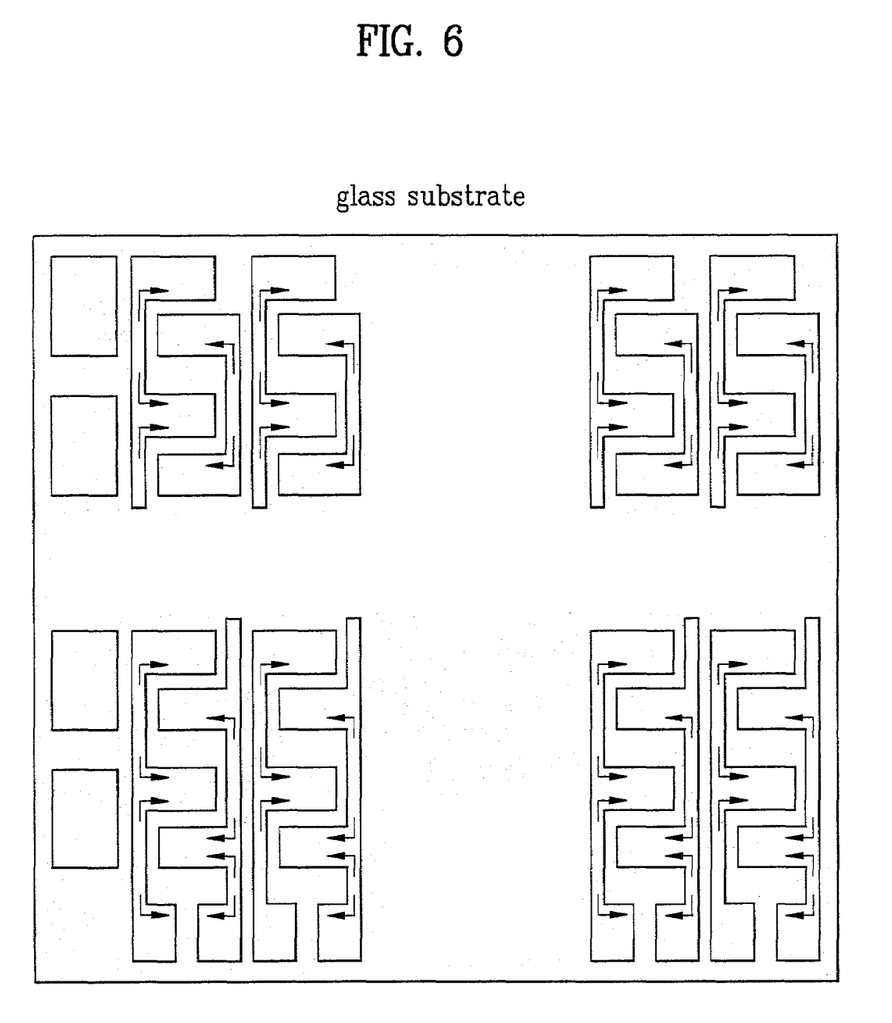

As shown in FIG. 5 and FIG. 6, transparent electrodes are formed on a glass substrate. At this time, the transparent electrodes are formed of indium tin oxide (ITO).

In FIG. 5, the transparent electrodes are pads for the data driver, the scan driver and the display panel.

The transparent electrodes are formed in an island type shown in FIG. 5. Or, the transparent electrodes are formed in that the even numbered transparent electrodes or the odd numbered transparent electrodes are connected to one another according to a direction of the data line shown in FIG. 6, thereby decreasing a line resistance of the data line.

Figure 7:
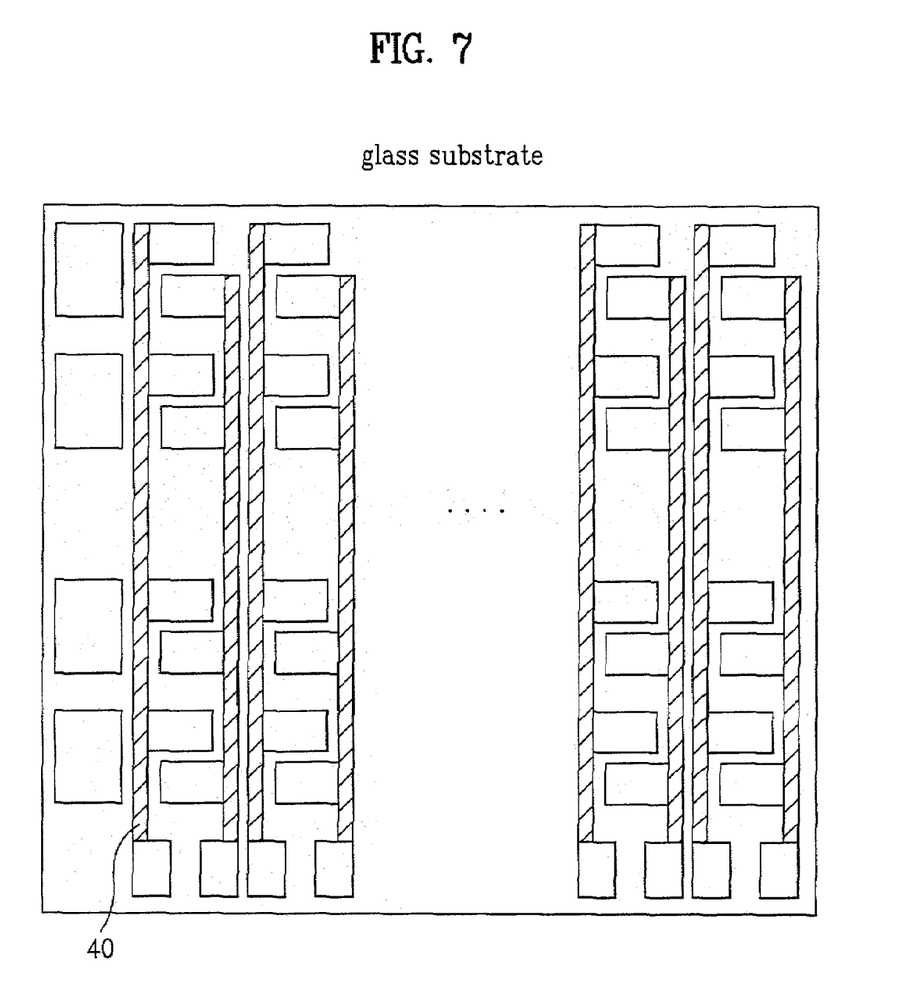

As shown in FIG. 7, a plurality of supplemental metal electrodes 40 are formed on the ITO for being electrically connected to the even numbered electrodes or the odd numbered electrodes.

The supplemental metal electrodes 40 decrease the resistance value of total anode lines (or data lines), thereby improving picture quality of the panel.

Figure 8:
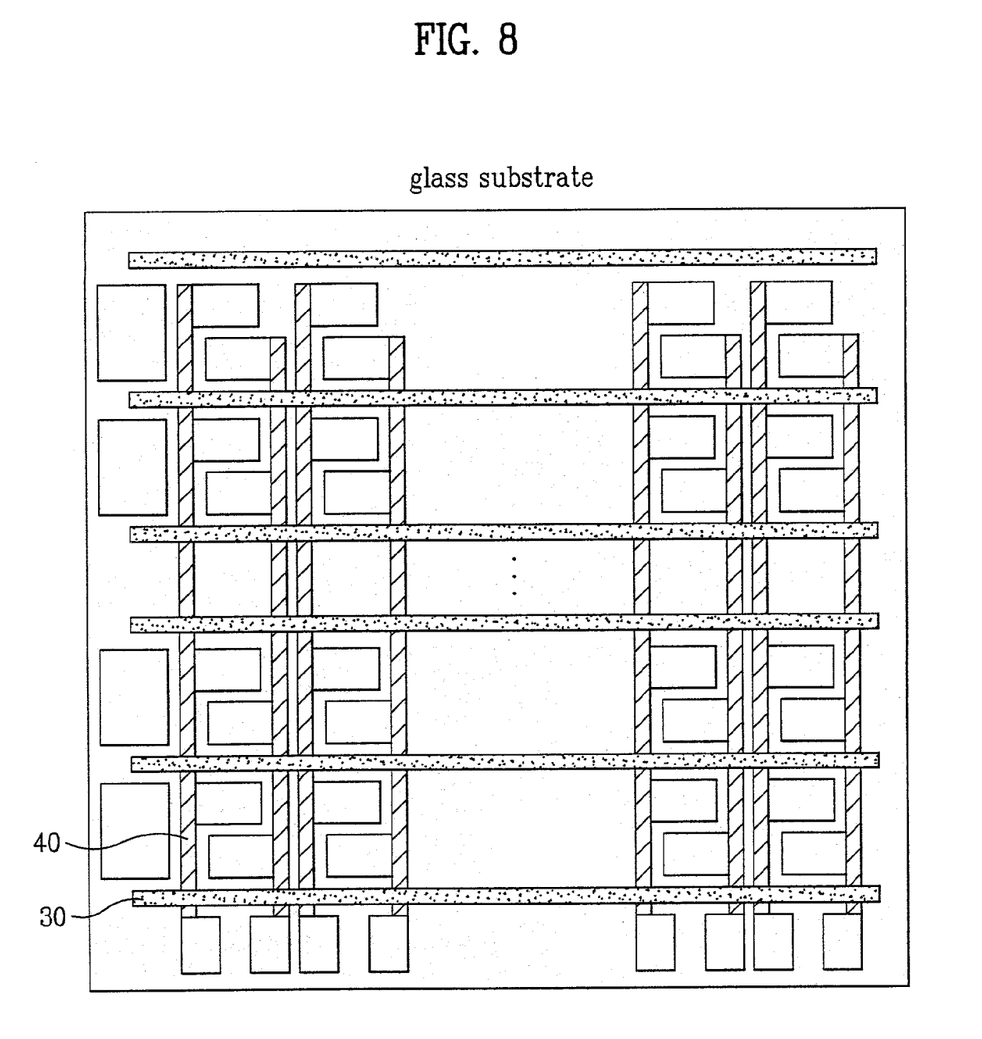

As shown in FIG. 8, a barrier 30 having at least one supplemental metal electrode 40 is formed in perpendicular to the supplemental metal electrode 40.

Figure 9:
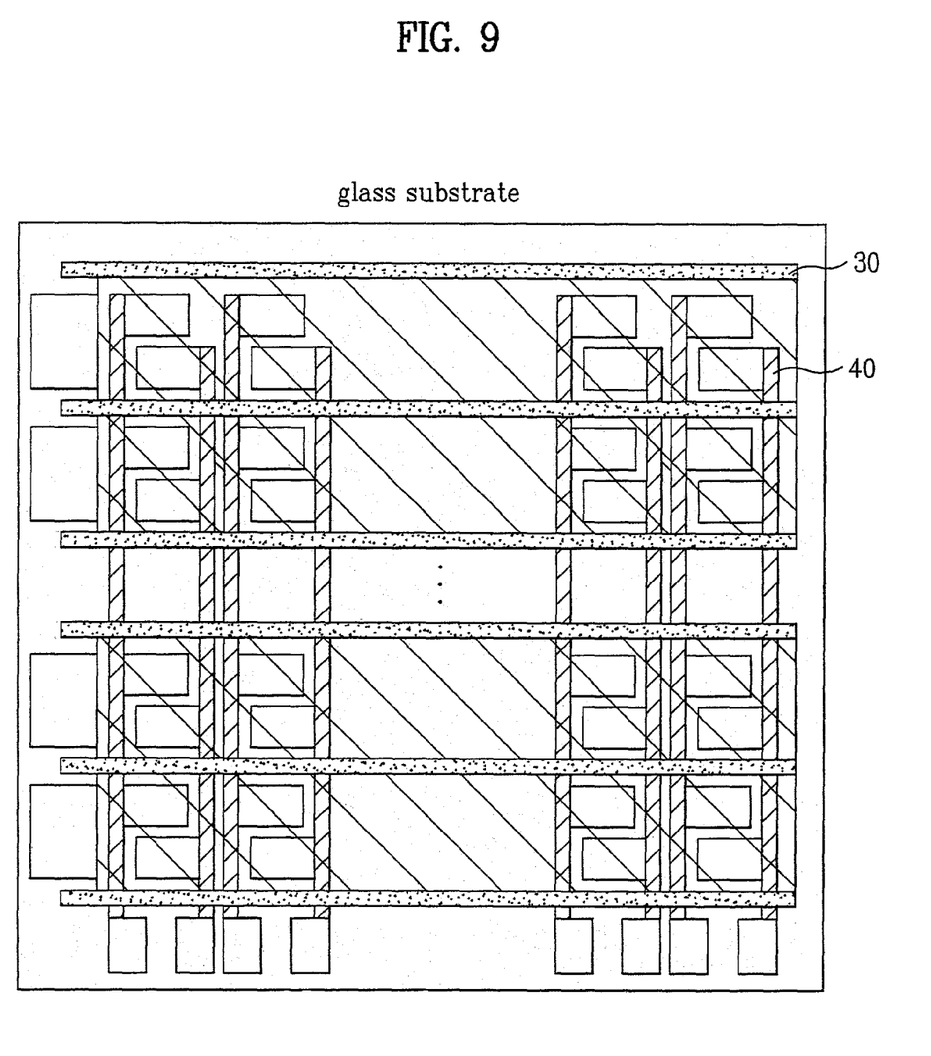

As shown in FIG. 9, an organic material is deposited on entire surfaces of the organic EL panel for forming the scan line.

Figure 10:
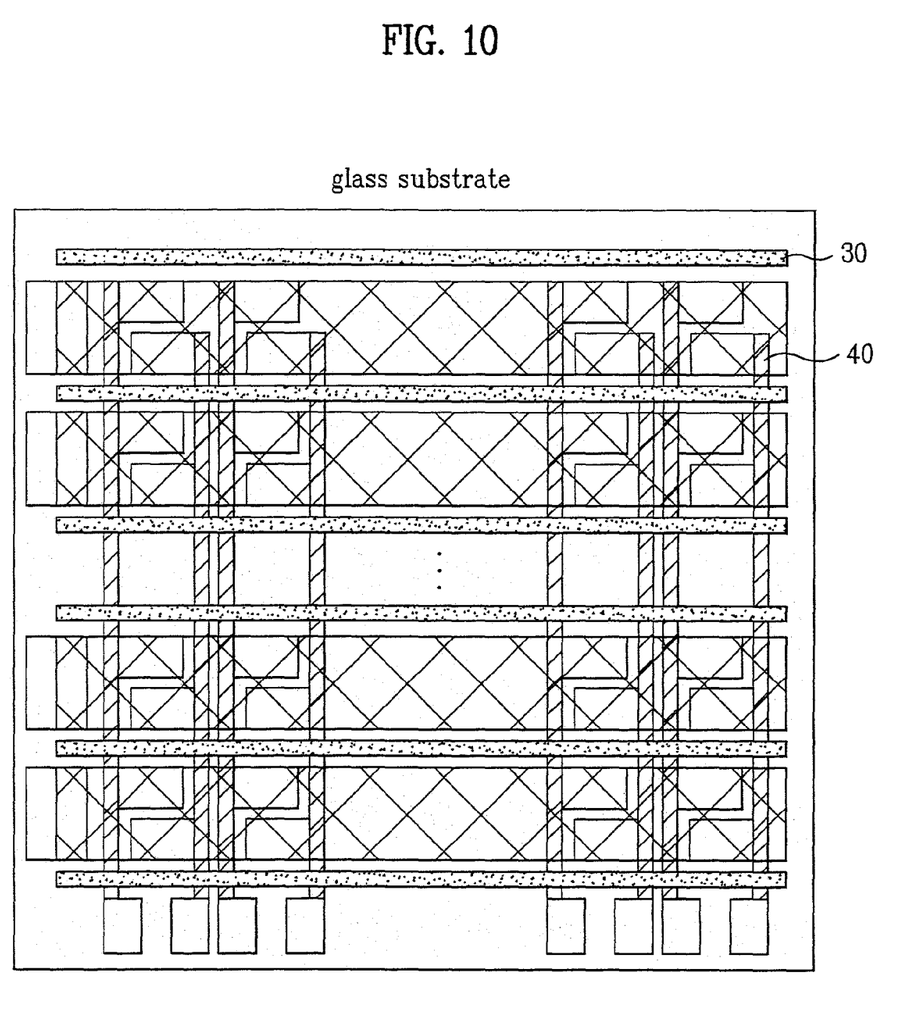

As shown in FIG. 10, a cathode is deposited on the organic material for forming the scan line, thereby completing process steps for forming the panel.

Then, a sealant is deposited on the panel, so that process steps for manufacturing a module are completed.

An operation of the display device according to the present invention will be explained with reference to the accompanying drawings.

Figure 11:
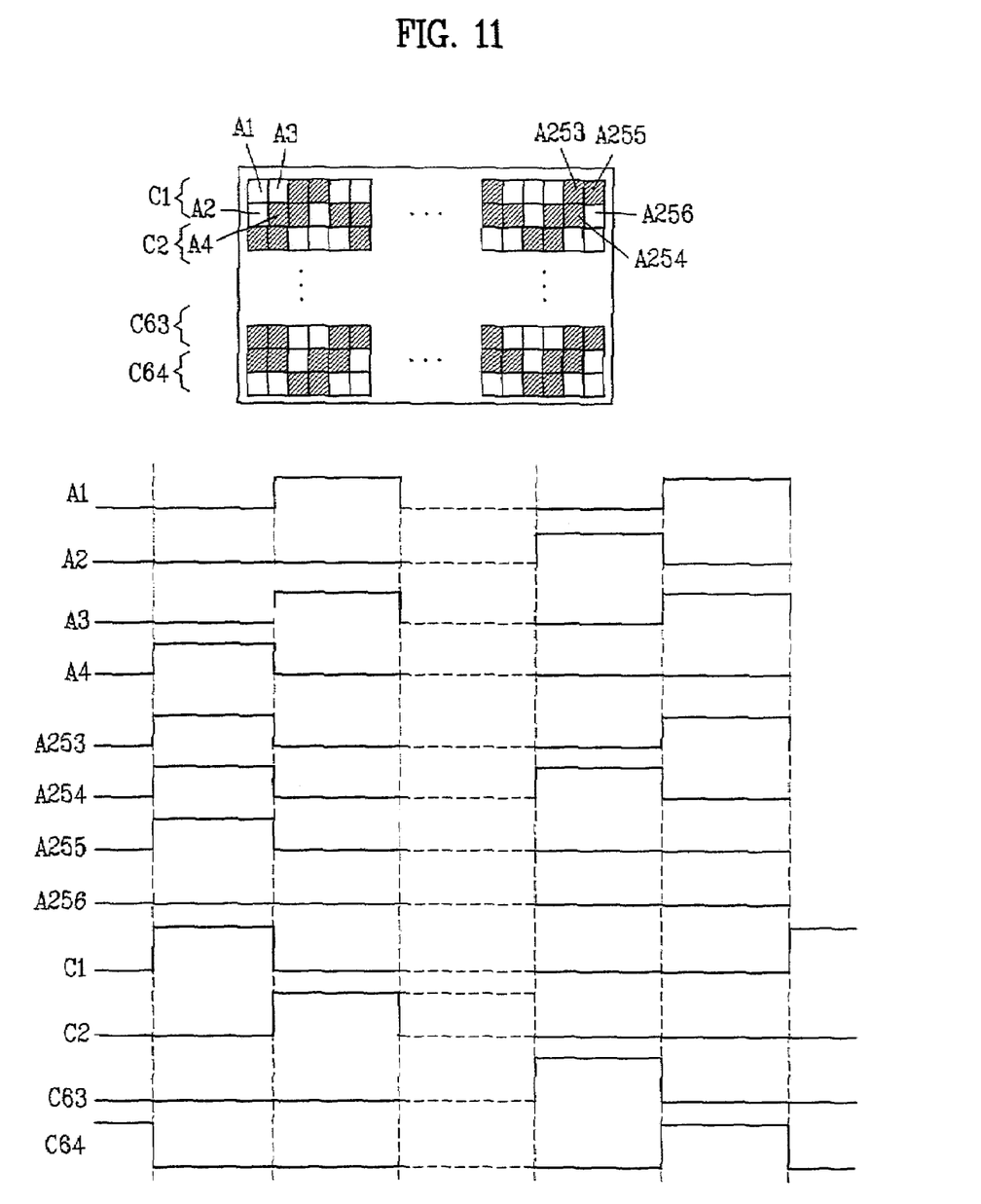
FIG. 11 is a view showing an operation of a display device according to a driving waveform in a scan structure of a display device according to the present invention.

FIG. 11 is a view showing an operation of a display device according to a driving waveform in a scan structure of a display device according to the present invention.

Two supplemental metal electrodes are connected to one scan line in parallel, so that light is selectively emitted from each electrode of the display panel according to the scan signals C1, C2, ..., C63, and C64 and the data signals A1, A2, ..., A254, A255 and A256.

As shown in FIG. 11, light is selectively emitted from the electrodes of the data signals from A1 to A256 by the scan signal C1 during applying the scan signal C1 to the display panel.

That is, when the scan signal C1 is applied, light is selectively emitted from the electrodes of the data signals A4, ..., A253, A255 by the scan signal C1.

Subsequently, light is selectively emitted from the electrodes of the data signals from A1 to A 256 by the scan signal C2 during applying the scan signal C2 to the display panel.

That is, when the scan signal C2 is applied, the electrodes of the data signals A1, A3, ... are in a high state, so that light is emitted from only the electrode corresponding to the above data signals.

According to a method mentioned above, light is selectively emitted from the electrodes of each line by sequentially applying the scan signal to the last scan signal C64 to the organic EL panel.

As mentioned above, the scan structure according to the present invention and the method for manufacturing the same has the following advantages.

First, only one data driver IC is used in the display device according to the present invention, so that it is possible to decrease the duty without the increase of a size in the display device.

Also, the electrodes are formed in one scan line in parallel, so that a driving time is increased, thereby decreasing the total duty.

The above present invention is not limited to the organic EL panel and the display device driven by the current. Accordingly, the present invention can be applicable to various display devices driven by the current and luminous devices.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. In a display device having a plurality of data lines formed in one direction, a plurality of scan lines formed perpendicular to the plurality of data lines, and a plurality of pixels formed at crossing points of the data and scan lines, a method for driving the display device comprising:
   forming pixels by forming at least a first and a second scan line and at least a first and second data line in a matrix type;
   connecting odd numbered row pixels of the first scan line to the first data line and connecting even numbered row pixels of the first scan line to the second data line for independently operating at least two pixels on the first scan line; and
   driving the first scan line, the first data line and the second data line to emit light from pixels on the first scan line.

2. The method as claimed in claim 1, wherein one scan signal is simultaneously applied to the first scan line.

3. The method as claimed in claim 2, wherein the first and second scan lines are divided by a barrier.

4. The method as claimed in claim 1, wherein the odd numbered row pixels are connected to the first data line, and the even numbered row pixels are connected to the second data line.

5. In a display device having a plurality of data lines formed in one direction, a plurality of scan lines formed perpendicular to the plurality of data lines, and a plurality of pixels formed at crossing points of the data and scan lines, a method for driving the display device having an organic EL panel includes forming a plurality of pixels by forming a plurality of scan lines and a plurality of data lines in a matrix type, wherein odd numbered row pixels associated with a first scan line are connected to a first data line and even numbered row pixels associated with the first scan line are connected to a second data line, the method further including driving the at least one scan lines, the first data line and the second data line to emit light from pixels on the first scan line.

6. In a display device having a plurality of data lines formed in one direction, a plurality of scan lines formed perpendicular to the plurality of data lines, and a plurality of pixels formed at crossing points of the data and scan lines, a method for driving the display device by a current driver includes forming a plurality of pixels in a matrix form along a first scan line, each of the plurality of pixels being connected to either a first data line or a second data line, wherein odd numbered row pixels of the first scan line are connected to the first data line and even numbered row pixels of the first scan line are connected to the second data line, the method further including driving the first scan line, the first data line and the second data line to emit light from pixels on the first scan line.

7. A scan structure of a display device comprising:
   a plurality of pixels formed by crossing a first scan line and at least two data lines, the pixels divided into odd numbered row pixels and even numbered row pixels, wherein odd numbered row pixels are connected to a first data line and even numbered row pixels are connected to a second data line;
   a data driver for applying a first data signal to the odd numbered row pixels and for applying a second data signal to the even numbered row pixels; and
   a scan driver for applying a scan signal to the first scan line, the display device emitting light from pixels on the first scan line when the scan driver applies the scan signal to the first scan line and the data driver applies the first data signal to the odd numbered row pixels and applies the second data signal to the even numbered row pixels.

8. A scan structure of a display device having an organic EL panel comprising:
   a plurality of pixels crossing a first scan line and at least two data lines, the pixels of the first scan line divided into odd numbered row pixels and even numbered row pixels, wherein odd numbered row pixels are connected to a first data line and even numbered row pixels are connected to a second data line;
   a data driver for applying a first data signal to the odd numbered row pixels and for applying a second data signal to the even numbered row pixels; and
   a scan driver for applying a scan signal to the first scan line, the display device emitting light from pixels on the first scan line when the scan driver applies the scan signal to the first scan line and the data driver applies the first data signal to the odd numbered row pixels and applies the second data signal to the even numbered row pixels.

9. A scan structure of a display device driven by a current comprising:
   a plurality of pixels formed at crossing points of a first scan line and at least two data lines, the pixels of the first scan line divided into odd numbered row pixels and even numbered row pixels, wherein odd numbered row pixels are connected to a first data line;

a data driver for applying a first data signal to the odd numbered row pixels and for applying a second data signal to the even numbered row pixels; and a scan driver for applying a scan signal to the first scan line, the display device emitting light from pixels on the first scan line based on the scan driver applying the scan signal to the first scan line and the data driver applying the first data signal to the odd numbered row pixels and applying the second data signal to the even numbered row pixels.

10. A scan structure in a display device comprising:

a plurality of scan lines formed in one direction each for electrically connecting at least two row data pixels;

a plurality of data lines formed perpendicular to the scan lines for connecting adjacent data pixels; and data and scan drivers selectively applying signals to the data and scan lines so that light is selectively emitted from corresponding pixels, the display device emitting light from pixels on a first one of the scan lines based on the data and scan drivers applying signals to the first one of the scan lines, odd numbered row data lines of the first one of the scan lines and even numbered row data lines of the first one of the scan lines.

11. The scan structure as claimed in claim 10, wherein an identical scan signal is applied to the data lines of two data pixels adjacent to each other.

12. The scan structure as claimed in claim 10, wherein electrically different data signals are applied to odd and even numbered row pixels.

13. A scan structure in a display device driven by a current driving device comprising:

a plurality of scan lines formed in one direction for electrically connecting at least two row data pixels;

a plurality of data lines formed perpendicular to the scan lines for connecting adjacent data pixels; and data and scan drivers selectively applying signals to the data and scan lines so that light is selectively emitted from corresponding pixels, the display device emitting light from pixels on a first one of the scan lines based on the data and scan drivers applying signals to the first one of the scan lines, odd numbered row data lines of the first one of the scan lines and even numbered row data lines of the first one of the scan lines.

14. In a display device having a plurality of data lines formed in one direction, a plurality of scan lines formed perpendicular to the plurality of data lines, and a plurality of pixels along a first scan line formed at crossing points of the data lines and the scan lines, a method for driving the display device comprising:

driving the first scan line using a first scan signal; and driving an odd numbered data line and driving an even numbered data line to emit light from at least two row pixels on the first scan line, each of the two row pixels formed on separate rows of the first scan line.

15. The method as claimed in claim 14, further comprising:

driving a second scan line using a second scan signal; and driving an odd numbered data line and driving an even numbered data line to emit light from the second scan line.

16. The method as claimed in claim 15, wherein the first and second scan lines are divided by a barrier.

17. The method as claimed in claim 14, wherein odd numbered row pixels are connected to the odd numbered data line, and even numbered row pixels are connected to the even numbered data line.

* * * * *